(12) United States Patent
Lindstedt et al.

(10) Patent No.: US 6,917,563 B2
(45) Date of Patent: Jul. 12, 2005

(54) INTEGRATED MEMORY

(75) Inventors: Reidar Lindstedt, München (DE); Johann Pfeiffer, Ottobrunn (DE)

(73) Assignee: Infineon Technologies AG, Munich (DE)

(*) Notice: Subject to any disclaimer, the term of this patent is extended or adjusted under 35 U.S.C. 154(b) by 77 days.

(21) Appl. No.: 10/681,503

(22) Filed: Oct. 8, 2003

(65) Prior Publication Data

US 2004/0109359 A1 Jun. 10, 2004

(30) Foreign Application Priority Data

Oct. 8, 2002 (DE) .......................... 102 46 790

(51) Int. Cl.⁷ .............................................. G11C 8/00
(52) U.S. Cl. ............. 365/233; 365/189.02; 365/189.12; 365/230.02
(58) Field of Search ................. 365/233, 189.02, 365/230.03, 189.12, 240, 194

(56) References Cited

U.S. PATENT DOCUMENTS

| | | | |
|---|---|---|---|
| 5,568,445 A | | 10/1996 | Park et al. |
| 6,134,180 A | * | 10/2000 | Kim et al. ................. 365/233 |
| 6,724,686 | * | 4/2004 | Ooishi et al. ............... 365/233 |
| 6,829,682 | * | 12/2004 | Kirihata et al. ............. 711/143 |
| 2001/0014922 | | 8/2001 | Kuge |

FOREIGN PATENT DOCUMENTS

| | | |
|---|---|---|
| DE | 195 07 562 A1 | 9/1995 |
| DE | 101 01 036 A1 | 8/2001 |

* cited by examiner

*Primary Examiner*—Son T. Dinh
(74) *Attorney, Agent, or Firm*—Laurence A. Greenberg; Werner H. Stemer; Ralph E. Locher

(57) ABSTRACT

An integrated memory contains an access controller for controlling an access for the purpose of reading data from, or writing data to, a memory cell array. The access controller accesses the memory cell array in a first double data rate operating mode of the memory in such a manner that a first data item (which is to be written) of an access cycle is written to the memory cell array with a write latency. In a second single data rate operating mode of the memory, the access controller, in contrast, accesses the memory cell array in such a manner that a first data item of an access cycle is, in contrast, written to the memory cell array in an accelerated manner without the write latency of the first operating mode. This makes it possible to read in data values in an accelerated manner in the second operating mode, in particular a test operating mode.

6 Claims, 5 Drawing Sheets

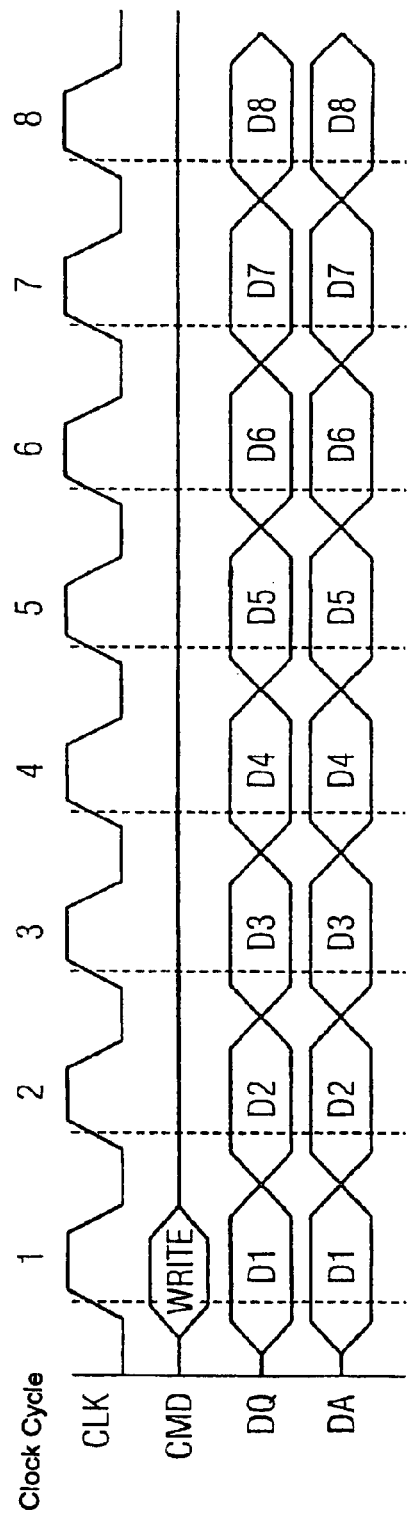
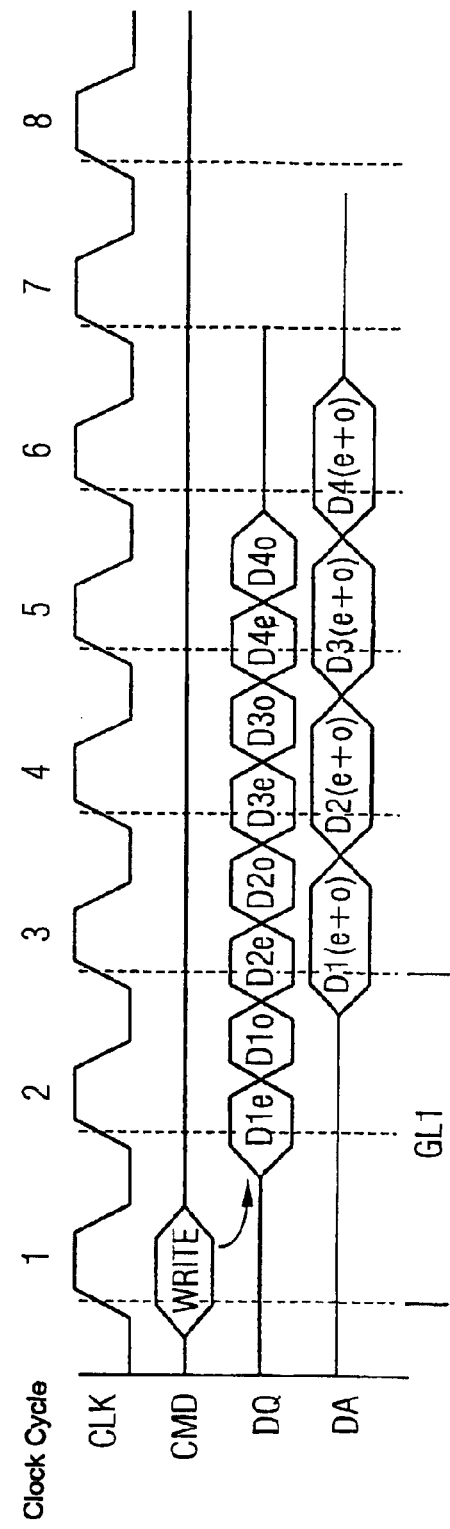

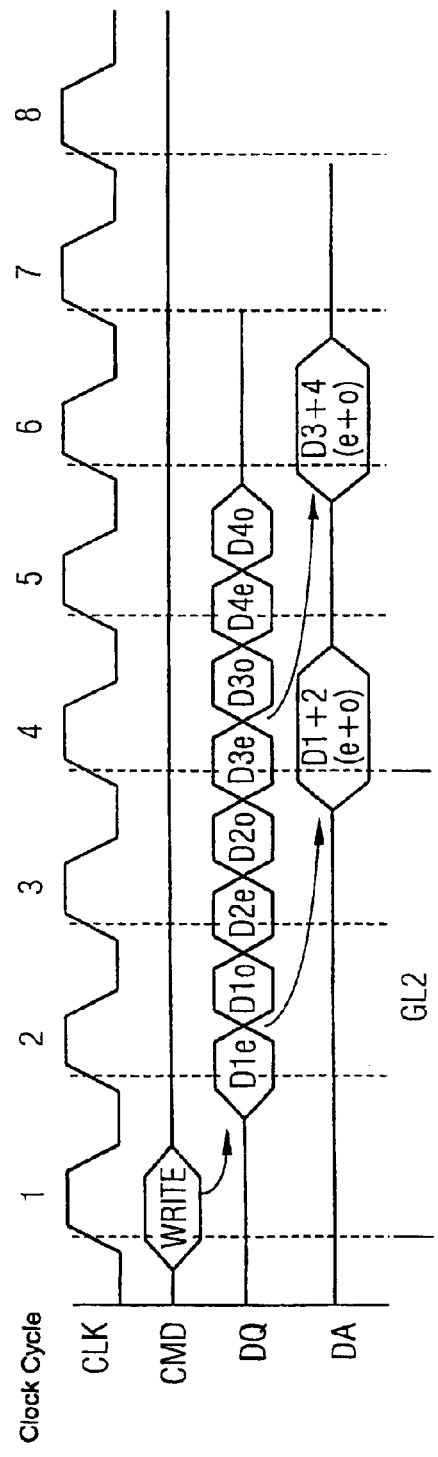
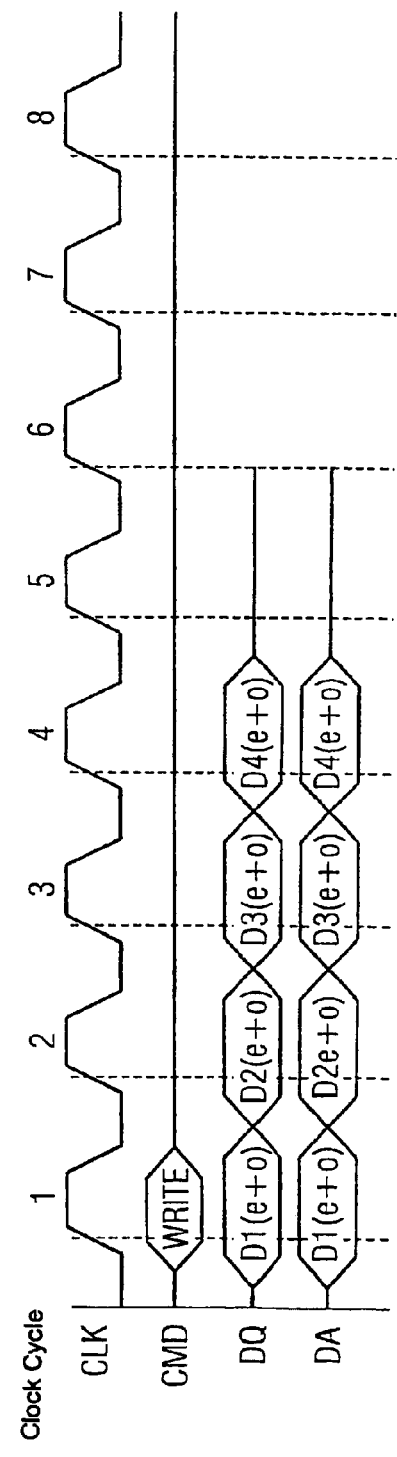

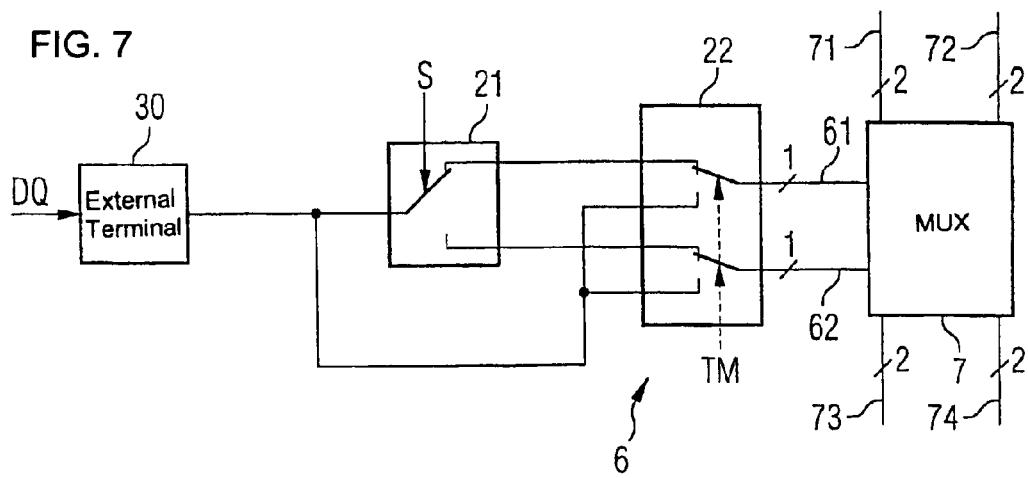
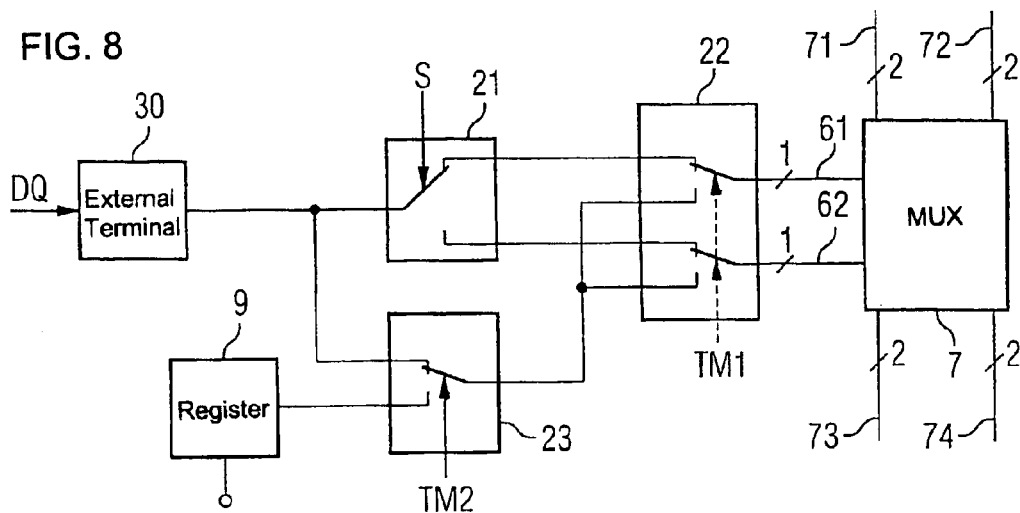
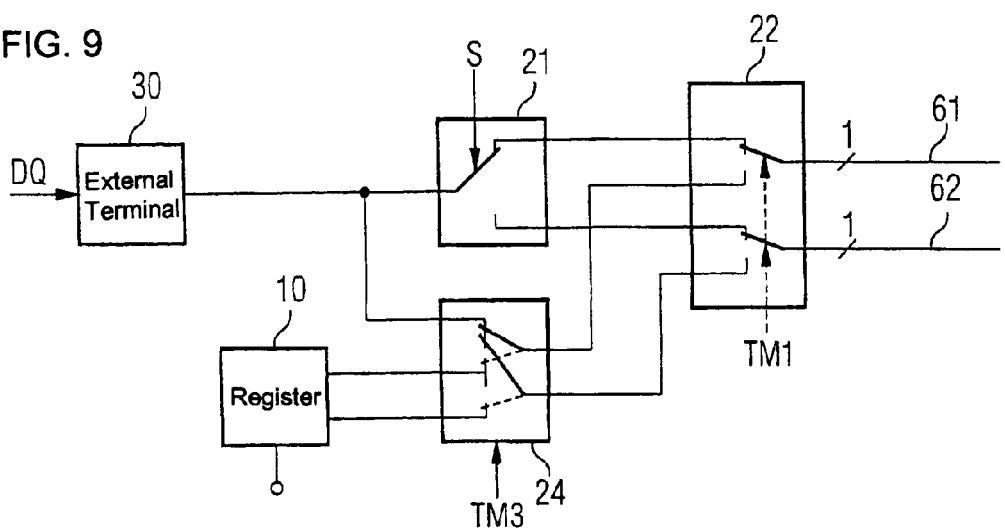

INTEGRATED MEMORY

BACKGROUND OF THE INVENTION

Field of the Invention

The present invention relates to an integrated memory having a memory cell array for storing data and an access controller for controlling an access to the memory cell array for the purpose of reading data from, or writing data to, the memory cell array.

Integrated memories, in particular dynamic random access memories (DRAMs) having a "double data rate" architecture (DDR DRAM), have comparatively high switching and access speeds. Integrated memories of this type generally have a clock signal for controlling the operating sequence of the memory. In DDR DRAMs, in contrast to "single data rate" DRAMs, at least two data packets are output or written in within one clock cycle, namely a first data packet with a rising edge of the clock signal and a second data packet with a falling edge of the clock signal.

DDR DRAMs of this type are typically configured in a "prefetch" architecture in order to be able to ensure the high data rate. In a prefetch architecture, data from different areas of the memory cell array, for example data from different memory banks, are fed in parallel from the memory cell array to a read/write amplifier and then to an output circuit. Following evaluation by the read/write amplifier, the data to be output are buffer-stored in an output register in order to then subsequently output the data (which have been received in parallel) serially within one clock cycle via an "off-chip" driver. The data are accordingly output at twice the clock rate.

An analogous mode of operation is implemented during a write access in a DDR DRAM. In order to provide the memory with a sufficient amount of time for the purpose of receiving and conditioning the write data, a "write latency" is generally defined as a delay time. The write data are written internally from the receiver circuits to the memory cell array via the data path only after the write latency. Depending on the type of DDR DRAM, at least two additional clock cycles or at least three additional clock cycles are defined by way of example for the write latency. A delay time of the same duration as the write latency thus elapses between the sending of a write command, for example from a connected controller, and the writing of a first data value to the memory cell array.

It is necessary for data to be written sequentially to the entire memory cell array in particular in a test mode of an integrated memory. In this case, the memory is conventionally tested under various operating conditions. To this end, prescribed data values are written to all of the memory cells in the memory cell array and are subsequently read out again in order to be compared with the prescribed data values. An error is detected if the data value that has been read out differs from the data value that has been written in. Since, when writing to relatively large parts of the memory cell array or to the entire memory cell array, it is necessary to repeatedly wait for the write latency prescribed as the standard, the test time of the integrated memory to be tested is comparatively long.

SUMMARY OF THE INVENTION

It is accordingly an object of the invention to provide an integrated memory that overcomes the above-mentioned disadvantages of the prior art devices of this general type, which enables, in an operating phase that differs from a normal mode, an accelerated mode of operation that is suitable in particular as a test mode of the memory.

With the foregoing and other objects in view there is provided, in accordance with the invention, an integrated memory. The integrated memory contains a memory cell array for storing data, and an access controller coupled to and controlling an access to the memory cell array for reading data from, and writing data to, the memory cell array. During a first operating mode, the access controller accesses the memory cell array for writing a first data item of an access cycle to the memory cell array with a write latency. During a second operating mode, the access controller accesses the memory cell array for writing the first data item of the access cycle to the memory cell array in an accelerated manner without the write latency of the first operating mode. The access controller accesses the memory cell array in accordance with a double data rate specification in the first operating mode and in accordance with a single data rate specification in the second operating mode.

The integrated memory, in particular in the form of a memory having a double data rate architecture, has the access controller, which accesses the memory cell array in a first operating mode in such a manner that a first data item (which is to be written) of an access cycle is written to the memory cell array with a write latency. The first operating mode is in particular a normal mode of the memory. In a second operating mode, the access controller of the memory accesses the memory cell array in such a manner that the first data item (which is to be written) of an access cycle is, in contrast, written to the memory cell array in an accelerated manner without the write latency of the first operating mode. The second operating mode is in particular a test mode of the memory, in which data are written successively to parts of the memory cell array or to the entire memory cell array.

According to the invention, the access controller may accordingly be operated differently in two different operating modes. In the first operating mode, a memory access is implemented in particular in accordance with a double data rate specification, that is to say the write latency is observed in accordance with the specification between the application of a write command and the writing of a first data item (to be written) to the memory cell array. In the second operating mode, the memory access is implemented in particular in accordance with a single data rate specification, in which case a first data item to be written is, in contrast, written to the memory cell array at an earlier point in time without the write latency of the normal mode. This makes it possible to write data values in an accelerated manner in the second operating mode.

This mode is particularly advantageous for the test case since the same data are generally written in this case to different areas of the memory cell array. Therefore, as a result of the same bit patterns being written to the cell array in the test mode, that it is possible, without an additional internal delay, for the data values to be written to the cell array in the very same clock cycle in which they are received by the memory chip. This enables an uninterrupted data stream for the test case.

In the second operating mode, the access controller of the memory according to the invention operates in a mode which is in accordance with a single data rate specification and in which, with the application of a write command, a first data item to be written is written to the memory cell array synchronously with the application of the write command. The data values are thus written immediately, without an additional delay, to the memory cell array using the write command, analogously to the single data rate specification. The data values may in this case be externally applied or else be generated via internal registers to which test data in particular may be externally written. To this end, a modified control logic unit is provided in the access controller in order to generate, in the same temporal sequence as in an SDR DRAM, all the internal control signals that are required for writing in data values. The data throughput is then affected continuously within a burst, with one data item in each case for each rising clock edge.

The present invention advantageously makes it possible to achieve a time saving of a plurality of clock cycles for each write access, in particular in a test mode of the memory. Since a write command has to be issued frequently in a mode of operation of this type, the time saving may amount to 150 ms (or 45%) or more, for example for a 128 Mbit memory having a burst length of 8 when the memory cell array is completely written to once. The time saving increases accordingly for shorter burst lengths. A saving of 19% of the test time is achieved in a "double March test" and a saving of 12% of the test time is achieved in a "triple March test". Since, in tests of this type, write operations within a test or even test flows are very often repeated, the invention results in a significant saving in the test time which, in many tests, such as in a "basic screen test", amounts to approximately 27% and, in a "retention test", amounts to approximately 13%. Savings in the range from 10 to 20% are thus expected for the "overall flow" of the test. This constitutes a marked saving in the test time and thus a marked reduction in costs in comparison with conventional test practices.

In accordance with an added feature of the invention, an external terminal for receiving data signals and a data path having at least two data lines coupled to the memory cell array, are provided. A first multiplexer is connected between the external terminal and the data path. The data lines of the data path are alternatively connected to the external terminal through the first multiplexer in the first operating mode. A second multiplexer is disposed in the data path and connected between the first multiplexer and the memory cell array. The data lines are connected, through the second multiplexer, to the first multiplexer in the first operating mode and to the external terminal in parallel in the second operating mode.

In accordance with another feature of the invention, a register, which can be written to externally is provided. A third multiplexer is connected to the register and to the external terminal. The data lines may be connected to the register in parallel or to the external terminal in parallel through the second and third multiplexers in the second operating mode.

In accordance with a further feature of the invention, a multibit register is provided and is written to externally. A third multiplexer is connected to the multibit register and to the external terminal. The data lines may be connected to a respective terminal of the multibit register or to the external terminal in parallel through the second and third multiplexers in the second operating mode.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a signal diagram of an SDR DRAM in a normal mode;

FIG. 3 is a signal diagram of a first type of DDR DRAM in the normal mode;

FIG. 4 is a signal diagram of a second type of DDR DRAM in the normal mode;

FIG. 5 is a signal diagram of the first type of DDR DRAM in the test mode according to the invention;

FIG. 7 is a block diagram of a first embodiment of an integrated memory according to the invention;

FIG. 8 is a block diagram of a second embodiment of the integrated memory according to the invention; and FIG. 9 is a block diagram of a third embodiment of the integrated memory according to the invention.

DESCRIPTION OF THE PREFERRED EMBODIMENTS

Figure 1:
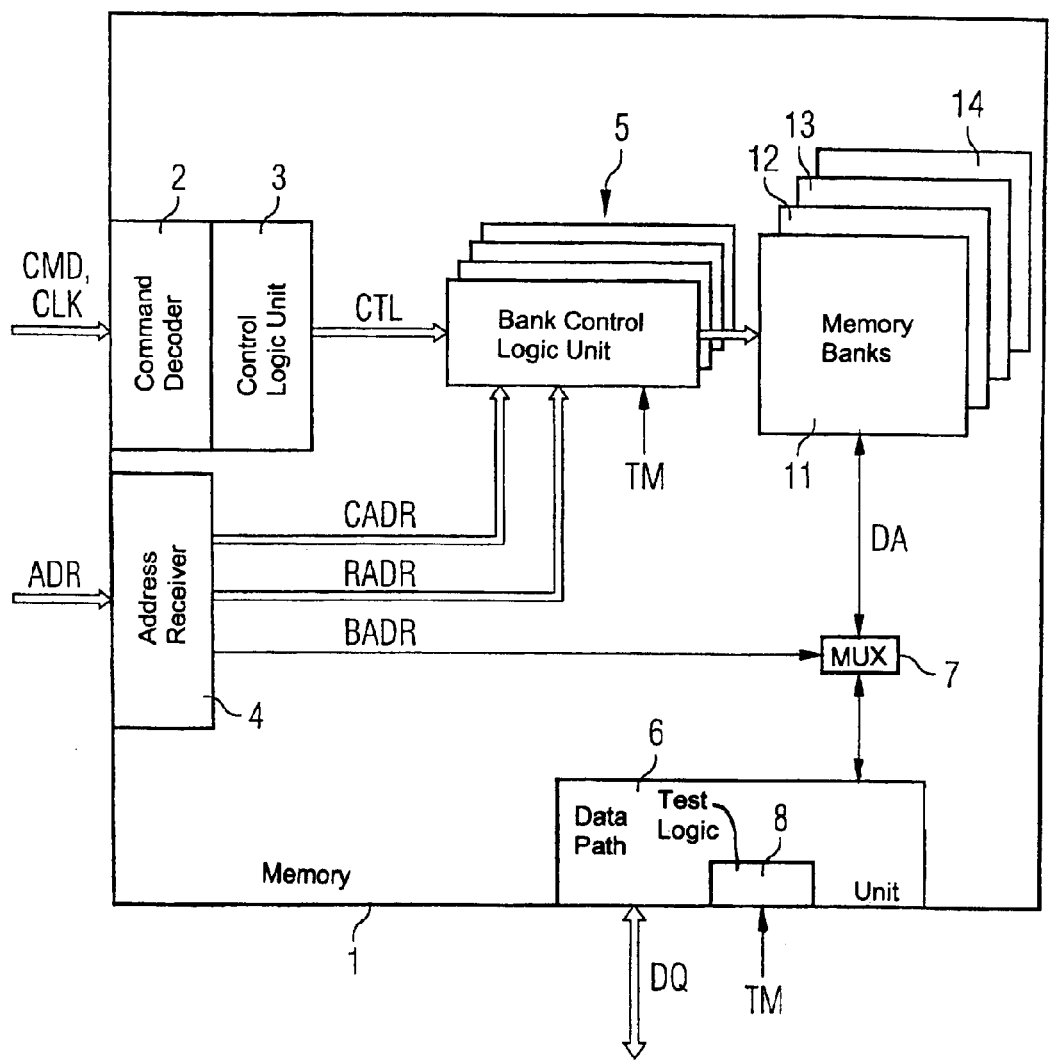
FIG. 1 is a schematic illustration of an embodiment of an integrated memory.

Referring now to the figures of the drawing in detail and first, particularly, to FIG. 1 thereof, there is shown a schematic illustration of an embodiment of an integrated memory 1. The memory 1 has a command decoder 2, which receives command signals CMD and a clock signal CLK. A control logic unit 3, which forwards control signals CTL to a bank control logic unit 5, is connected to the command decoder 2. The memory 1 furthermore has an address receiver 4, which receives address signals ADR. The address receiver 4 outputs column addresses CADR and row addresses RADR to the bank control logic unit 5. A bank address BADR is furthermore forwarded to a bank multiplexer 7. The bank multiplexer 7 is connected, on the one hand, to the memory cell array, which is subdivided into the memory banks 11 to 14. On the other hand, the bank multiplexer 7 is connected to a data path 6, via which data signals DQ are received and output by way of a plurality of I/O pads. A test logic unit 8 is furthermore provided, the test logic unit 8 being driven by a test mode signal TM. The test mode signal TM also serves to control the bank control logic unit 5 in order to switch the latter over between a plurality of operating modes.

FIG. 2 illustrates a signal diagram of an SDR DRAM in the normal mode. FIGS. 3 and 4 show respective signal diagrams of two different types of DDR DRAM. A write access is described by way of example in more detail below with reference to the signal diagrams shown in FIGS. 2 to 4. In this case, write data having a burst length of 8 are written to the memory cell array in all of the examples.

An activation command is first read into the memory using the command signals CMD. Furthermore, a row address RADR in the form of a word line address is applied to the corresponding address pins for reception by the address receiver 4. The control logic unit 3 decodes the activation command and sends a corresponding activation control signal to the bank control logic unit 5. A word line in one of the memory banks 11 to 14 is activated in the bank control logic unit 5 by the activation control signal and the applied word line addresses. In the further course of events, a write command WRITE is decoded in the control logic unit 3 and a corresponding write control signal is forwarded to the bank control logic unit 5. A column address CADR is applied to the address pins in the meantime. The bank control logic unit 5 activates a column select line by the write control signal and the applied column address CADR. The data DQ that have been applied for example by an external controller using the write command are now written to the memory cell array.

FIG. 2 illustrates the timing of an SDR DRAM. In this case, the externally applied data DQ are written to the memory cell array, without a write latency at the beginning of the access, by virtue of eight data values D1 to D8 being written without interruption with respect to each rising clock edge of the clock signal CLK. The data ultimately written to the memory cell array by the bank multiplexer 7 are designated DA.

FIGS. 3 and 4 show respective timing signal diagrams of different types of DDR DRAM during the write access. Memories of this type are typically configured in a prefetch architecture, with data values being received serially via the external terminal and being written in parallel to different areas of the memory cell array. In this case, the external data are respectively transmitted with the rising and falling clock edges of the clock signal CLK. The received data DQ are buffer-stored for a certain amount of time and are written to the memory cell array after a write latency. In the example shown in FIG. 3, the overall write latency GL1 amounts to two clock cycles and, in the example shown in FIG. 4, the overall write latency GL2 amounts to three clock cycles. The data values that are transmitted with the rising clock edge are also referred to as "even data" (e.g. D1e) and the data values that are transmitted with the falling clock edge are referred to as "odd data" (e.g. D1o). Once these data values have been received, even and odd data are written in parallel as write data DA to the memory cell array. The memory in accordance with the signal diagram shown in FIG. 3 is operated using "2n" prefetch architecture and the memory in accordance with the signal diagram shown in FIG. 4 is operated using 4n prefetch architecture.

Figure 6:
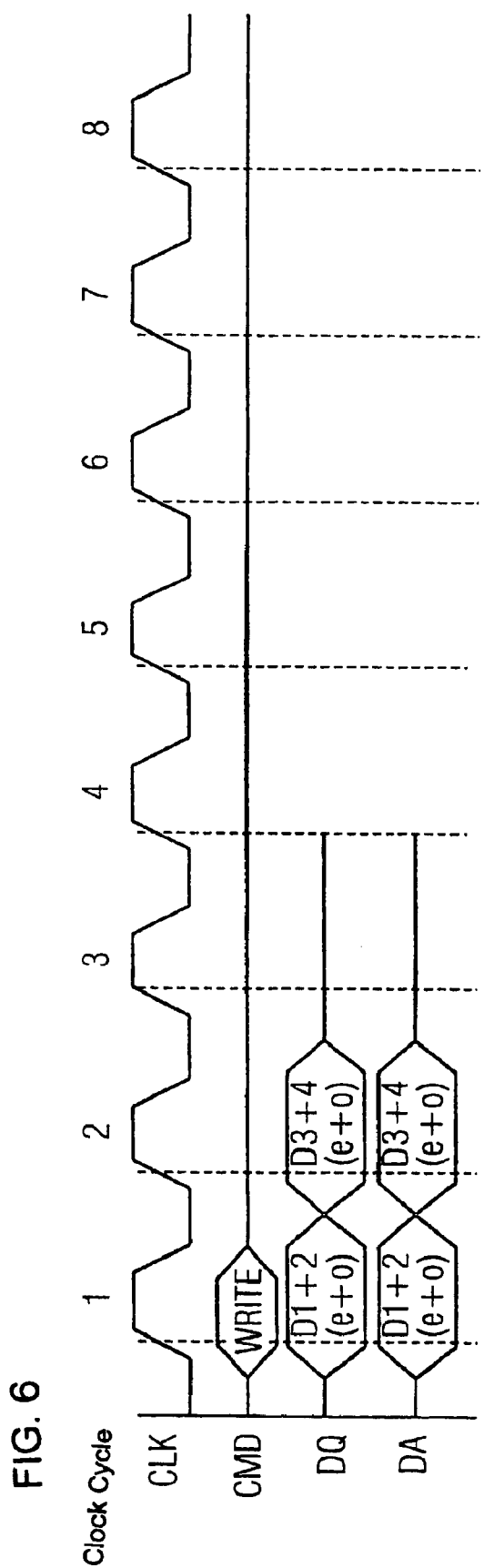
FIG. 6 is a signal diagram of the second type of DDR DRAM in the test mode according to the invention.

FIGS. 5 and 6 illustrate respective signal diagrams showing the operating sequence of the two above-mentioned DDR DRAM types in a test mode according to the invention. In this case, the memory access is controlled in particular by the bank control logic unit 5, which receives the test mode signal TM, in such a manner that the respective data item D1 to be written first is, in contrast, written to the memory cell array in an accelerated manner without the write latency of the normal mode (FIGS. 2 to 4). In particular, the data item D1 is written to the memory cell array with the rising edge of the clock signal CLK synchronously with the application of the write command. This dispenses with the overall write latency, illustrated in FIGS. 3 and 4, when writing in the data in the test mode. The write data are immediately written to the memory cell array without a further delay using the write command, analogously to the SDR specification.

FIG. 7 shows, in a roughly diagrammatic fashion, an embodiment of the integrated memory according to the invention. A data signal DQ is received via an external terminal 30 in the form of an I/O pad. The data path 6 has two data lines 61 and 62, the data line 61 constituting, for example, an "even" data line and the data line 62 constituting an "odd" data line. The data lines 61, 62 are connected to the bank multiplexer 7, which respectively writes even and odd data in parallel to the memory cell array via the data lines 71 to 74. A first multiplexer 21 is furthermore provided, the first multiplexer 21 being connected between the terminal 30 and the data path 6. In this case, the data lines 61 and 62 of the data path 6 may alternatively be connected to the external terminal 30 via the multiplexer 21 in the normal operating mode. That is to say, serial data DQ received via the terminal 30 are alternately distributed to the data lines 61 and 62, respectively, upon the rising and falling edges. The multiplexer 21 is driven by control signal S.

According to the invention, a second multiplexer 22, which is driven via the test mode signal TM, is provided in the data path 6 between the multiplexer 21 and the bank multiplexer 7. In this case, the data lines 61 and 62 are connected to the first multiplexer 21 via the multiplexer 22 in the normal mode (switch position shown) and the data lines 61 and 62 are connected to the external terminal 30 in parallel in the test operating mode. The additional multiplexer 22 makes it possible to place a data item to be written on the two data lines 61 and 62 at the same time.

FIG. 8 shows a further embodiment of the integrated memory according to the invention. This embodiment provides an additional register 9, in which a test data bit for the test mode may be stored, for example. The register makes it possible to write to the memory cell array during the write access without an additional write latency, since the register contents have already been externally programmed before the actual write operation and are thus already available early on. In the test mode, the test data bit stored in the register 9 is written, for example, to all of the memory cells in the memory cell array.

The register 9 is connected to a third multiplexer 23, which, in addition, is connected to the external terminal 30. The multiplexer 23 is driven by the test mode signal TM2 and the multiplexer 22 is driven by the test mode signal TM1. The multiplexer 23 is used to connect the data lines 61 and 62 to the register 9 in parallel or to the external terminal 30 in parallel in the test mode. That is to say, the multiplexers 22 and 23 can be used in the test mode to decide whether a data item DQ at the external terminal 30 or the test data bit of the register 9 is simultaneously present on both data lines 61 and 62.

FIG. 9 shows a further embodiment of the integrated memory according to the invention. In comparison with FIG. 8, a multibit register 10 is provided instead of the register 9, the multibit register 10 likewise being used to store test data bits. Instead of the multiplexer 23 shown in FIG. 8, a fourth multiplexer 24 is provided in the embodiment shown in FIG. 9, the fourth multiplexer 24 being connected to the multibit register 10 and to the external terminal 30. The multiplexer 24 is driven by the test mode signal TM3. In this case, the data lines 61 and 62 may be connected either to a respective terminal of the multibit register 10 or to the external terminal 30 in parallel via the multiplexer 22 and the multiplexer 24 in the test operating mode. In that switch position of the multiplexer 24 which is illustrated by continuous lines, an externally applied data item DQ is transferred in parallel onto the data lines 61 and 62. In the switch position that is illustrated by dashes, a respective test data bit is transferred onto the lines 61 and 62. This makes it advantageously possible to write differently to the even and odd data lines even in the test mode.

We claim:

1. An integrated memory, comprising:

a memory cell array for storing data; and an access controller coupled to and controlling an access to said memory cell array for reading data from, and writing data to, said memory cell array, during a first operating mode said access controller accessing said memory cell array for writing a first data item of an access cycle to said memory cell array with a write latency, during a second operating mode said access controller accessing said memory cell array for writing the first data item of the access cycle to said memory cell array in an accelerated manner without the write latency of the first operating mode, said access controller accessing said memory cell array in accordance with a double data rate specification in the first operating mode and in accordance with a single data rate specification in the second operating mode.

2. The integrated memory according to claim 1, wherein said access controller accesses said memory cell array in the second operating mode for writing the first data item to said memory cell array synchronously with an application of a write command.

3. The integrated memory according to claim 1, further comprising:

an external terminal for receiving data signals;

a data path having at least two data lines coupled to said memory cell array;

a first multiplexer connected between said external terminal and said data path, said data lines of said data path are alternatively connected to said external terminal through said first multiplexer in the first operating mode; and a second multiplexer disposed in said data path and connected between said first multiplexer and said memory cell array, said data lines being connected, through said second multiplexer, to said first multiplexer in the first operating mode and to said external terminal in parallel in the second operating mode.

4. The integrated memory according to claim 3, further comprising:

a register, which can be written to externally; and a third multiplexer connected to said register and to said external terminal, said data lines may be connected to said register in parallel or to said external terminal in parallel through said second and third multiplexers in the second operating mode.

5. The integrated memory according to claim 3, further comprising:

a multibit register being written to externally; and a third multiplexer connected to said multibit register and to said external terminal, said data lines may be connected to a respective terminal of said multibit register or to said external terminal in parallel through said second and third multiplexers in the second operating mode.

6. The integrated memory according to claim 1, wherein the first operating mode is a normal mode and the second operating mode is a test mode of the integrated memory.

* * * * *